United States Patent
Benwadih et al.

(10) Patent No.: US 10,734,566 B2
(45) Date of Patent: Aug. 4, 2020

(54) THERMAL PATTERN SENSOR WITH PYROELECTRIC CAPACITANCE AND HARD PROTECTIVE LAYER

(71) Applicant: COMMISSARIAT A L'ENERGIE ATOMIQUE ET AUX ENERGIES ALTERNATIVES, Paris (FR)

(72) Inventors: Mohammed Benwadih, Champigny sur Marne (FR); Christophe Serbutoviez, Voiron (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 71 days.

(21) Appl. No.: 16/207,653

(22) Filed: Dec. 3, 2018

(65) Prior Publication Data
US 2019/0172993 A1    Jun. 6, 2019

(30) Foreign Application Priority Data

Dec. 4, 2017 (FR) .................................... 17 61601

(51) Int. Cl.
*H01L 37/02* (2006.01)
*G06K 9/00* (2006.01)
(Continued)

(52) U.S. Cl.
CPC ............ *H01L 37/02* (2013.01); *G01J 5/34* (2013.01); *G06K 9/0002* (2013.01); *H01L 27/16* (2013.01); *H01L 37/025* (2013.01)

(58) Field of Classification Search
CPC .... G01J 5/34; G01J 2005/345; G06K 9/0002; G06K 9/00053; H01L 27/16; H01L 37/02; H01L 37/025
See application file for complete search history.

(56) References Cited

U.S. PATENT DOCUMENTS

| 4,394,773 A | 7/1983 | Ruell |
| 4,429,413 A | 1/1984 | Edwards |

(Continued)

FOREIGN PATENT DOCUMENTS

| EP | 2385486 A1 | 11/2011 |
| EP | 3129996 B1 | 7/2017 |

(Continued)

OTHER PUBLICATIONS

Search Report for French Application No. 17 61601 dated Aug. 1, 2018.

(Continued)

*Primary Examiner* — Chih-Cheng Kao
(74) *Attorney, Agent, or Firm* — Pearne & Gordon LLP

(57) ABSTRACT

Thermal pattern sensor comprising several pixels arranged on a substrate, each pixel including at least: a pyroelectric capacitance formed by at least one portion of pyroelectric material arranged between at least one lower electrode and at least one upper electrode, with the lower electrode arranged between the substrate and the portion of pyroelectric material, a dielectric layer such that the upper electrode is arranged between the portion of pyroelectric material and the dielectric layer, a heating element including at least one deposition of electrically conductive particles and such that the dielectric layer is arranged between the upper electrode and the heating element, a protective layer arranged between the dielectric layer and the heating element and including at least one material of which the Shore A hardness is greater than or equal to around 60.

12 Claims, 1 Drawing Sheet

(51) Int. Cl.
*H01L 27/16* (2006.01)
*G01J 5/34* (2006.01)

(56) References Cited

U.S. PATENT DOCUMENTS

| | | |
|---|---|---|
| 6,289,114 B1 | 9/2001 | Mainguet |
| 8,801,274 B2 | 8/2014 | Mainguet et al. |
| 2017/0243875 A1 | 8/2017 | Khan |
| 2018/0145396 A1 | 5/2018 | Benwadih et al. |
| 2018/0155508 A1 | 6/2018 | Benwadih et al. |
| 2018/0254185 A1 | 9/2018 | Benwadih et al. |
| 2018/0356291 A1* | 12/2018 | Mainguet .................. G01J 5/34 |
| 2019/0170587 A1* | 6/2019 | Benwadih ............ G06K 9/0002 |
| 2019/0172994 A1* | 6/2019 | Benwadih ................. G01J 5/34 |
| 2019/0204167 A1* | 7/2019 | Benwadih ............... H01L 37/02 |

FOREIGN PATENT DOCUMENTS

| | | |
|---|---|---|
| FR | 3044408 A1 | 6/2017 |
| JP | 2004279103 A | 10/2004 |

OTHER PUBLICATIONS

Nordisk Plast et al: "Technical Data Sheet Technical Data Sheet" Jun. 1, 2012, XP055496423, URL: http://www.nordiskplast.dk/pictures_or g/PVDF.pdf.

U.S. Appl. No. 16/207,614; entitled "Thermal Pattern Sensor With Pyroelectric Capacitor Comprising a SOL-GEL Matrix and Metallic Oxide Particles", filed Dec. 3, 2018.

U.S. Appl. No. 16/207,846; entitled "Thermal Pattern Sensor With Pyroelectric Capacitor", filed Dec. 3, 2018.

U.S. Appl. No. 16/207,313; entitled "Thermal Pattern Sensor With Pyroelectric Capacitance", filed Dec. 3, 2018.

* cited by examiner

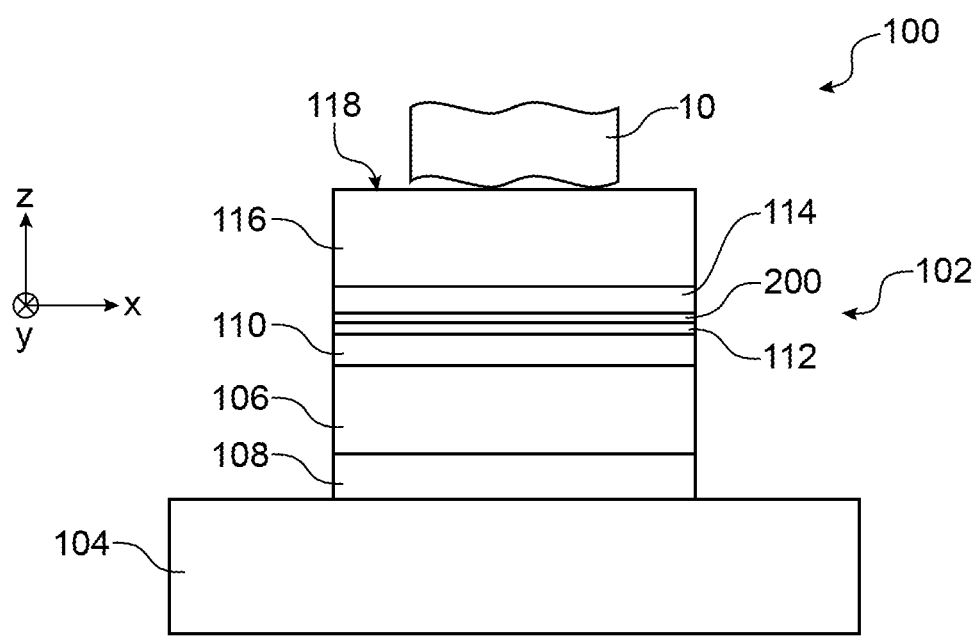

THERMAL PATTERN SENSOR WITH PYROELECTRIC CAPACITANCE AND HARD PROTECTIVE LAYER

TECHNICAL FIELD AND PRIOR ART

The invention relates to a thermal pattern sensor exploiting the pyroelectric properties of a material, and advantageously forming a finger print sensor.

Finger print detection may be carried out by so-called "passive" sensors exploiting a difference in temperature between that of the finger and that of the sensor, as described in the documents U.S. Pat. Nos. 4,394,773, 4,429,413 and 6,289,114. At the ridges of the print, the skin of the finger is in direct physical contact with the sensor. A thermal transfer between the skin and the contact surface of the sensor takes place by conduction, which leads to a first temporal variation in temperature. At the valleys of the print, the skin of the finger is not in direct physical contact with the sensor. A thermal transfer between the skin and the contact surface of the sensor takes place through air, which is rather a heat insulator, which leads to a second temporal variation in temperature, less important. The difference between these two temporal variations in temperature is reflected by a difference between signals measured by the pyroelectric capacitances, depending on whether they lie under a valley or under a ridge of the print. The image of the print then has a contrast that depends on this difference.

However, these sensors have the drawback of carrying out a measurement that depends uniquely on the difference between the temperature of the finger and the temperature of the sensor. Thus, after several seconds of contact between the finger and the sensor, the temperature of the finger and the temperature of the contact surface are homogenised, and it is no longer possible to obtain a satisfactory contrast. It may also happen that the level of the signal obtained is zero when the finger and the sensor are at the same temperature, or instead that the contrast of the captured images varies, which then poses problems during the later processing of the images obtained (for example, an inversion of the temperatures leads to an inversion of the image obtained).

Another type of sensor, of active type, offers a solution to this problem thanks to the addition of heating elements under the contact surface of the sensor. Such a sensor is described for example in the patent application EP 2 385 486 A1. The heating elements dissipate a certain amount of heat in each pixel of the sensor and the heating of the pixels is measured at the end of a certain time. The variation in temperature obtained is thus significant at the valleys of the print, where heat is transferred to the finger through air, and lower at the ridges of the print, where heat is transferred directly to the finger, by conduction. This leads to a lower final temperature in the case of a pixel in the presence of a ridge of the print, where heat is absorbed by the skin, compared to a pixel in the presence of a valley of the print where heat is rather conserved in the pixel. This makes it possible to improve and to conserve over time the contrast of an image acquired using said sensor.

The elements described above for finger print detection also apply to the detection of a thermal pattern other than a finger print, the element of which the thermal pattern to detect being arranged on the sensor during the measurement.

A thermal pattern sensor comprises thermal detection means which may be pyroelectric elements, diodes, thermistors or any other temperature sensitive element making it possible to convert a variation in temperature into a variation in potential or electric current.

More specifically, a pyroelectric type sensor comprises a matrix of pyroelectric capacitances arranged on a substrate, for example made of glass.

Each pyroelectric capacitance comprises a layer made of pyroelectric material, arranged between a lower electrode and an upper electrode. One of these two electrodes is taken to a constant potential, and forms a reference electrode. The other electrode collects the pyroelectric charges, generated by the pyroelectric material in response to a variation in temperature. The upper electrode is covered with a protective layer on which the element of which thermal pattern is measured, for example a finger, is intended to be laid during the measurement.

The pyroelectric material may be for example a poly (vinylidene fluoride-trifluoroethylene) or P(VDF-TrFE) or PVDF (polyvinylidene fluoride), a ceramic such as PZT (lead zirconate titanate), AlN, $BaTiO_3$ or ZnO. Other pyroelectric materials are possible, namely all those that produce electrical charges as a function of a pyroelectric parameter.

In the case of an active thermal sensor, the sensor is also provided with a heating element. This heating element is for example produced in the form of a coil partially surrounding the upper electrodes and making it possible to heat laterally the pyroelectric capacitances, at the upper electrodes.

Each pyroelectric capacitance forms a transducer which translates a temporal variation in temperature into an electrical signal such as a difference in electrical potentials.

When the sensor has to have a large surface and be produced at a low cost, it is advantageously produced using so-called printed technology, or by printing, less expensive than lithography on semiconductor. Different portions of materials forming the elements of the pixels of the sensor may in this case be produced with inks that are sufficiently stable so as not to require high performance encapsulation. The production of at least one part of the elements of the sensor may be envisaged by printing, for example on simple plastic substrates.

Such a sensor produced by printing depositions comprises one or more electrically conductive portions (electrode(s) and/or heating element) produced by deposition of ink comprising conductive particles, for example silver, which form, after evaporation of the solvent, the electrically conductive portion(s). These particles may have geometric shapes with salient angles which can deteriorate the sensor when the finger, or more generally the element of which the thermal pattern is intended to be captured, is laid on the sensor. Apart from these salient angles, the sensor may also be deteriorated by the roughnesses formed by these electrically conductive portions produced by depositions of conductive inks, this roughness being for example of the order of 1.5 µm RMS and due to the inhomogenities of the depositions as well as the shape of the particles. For example, a sensor may comprise, for each pixel, a pyroelectric capacitance, a dielectric layer arranged on the pyroelectric capacitance, a conductive portion forming the heating element of the pixel and which is arranged on the dielectric layer, and a surface protective layer covering the heating element and on which the finger is intended to be laid during a print capture. The conductive portion forming the heating element may be produced by printing of an ink comprising particles of silver. When the finger presses on the sensor, the particles of silver and/or the roughnesses of the conductive portion forming the heating element can pierce the dielectric layer on which this conductive portion lies, and thereby damage the pyroelectric capacitance lying under the dielectric layer. By piercing the dielectric layer, conduction paths may be created between the conductive portions forming the heating elements and the upper electrodes of the pyroelectric capacitances of the pixels, causing considerable leakage currents within the pixels, which prevents the correct operation of the device. In the case of particles of large sizes, it is even possible to end up with total deterioration of the sensor, making it non-operational.

DESCRIPTION OF THE INVENTION

There thus exists a need to propose a thermal pattern sensor in which the risks of degradation of the sensor due to the conductive portions forming the heating elements and comprising depositions of electrically conductive particles are reduced or eliminated.

To do so, a thermal pattern sensor comprising several pixels arranged on a substrate is proposed, each pixel including at least:
- a pyroelectric capacitance formed by at least one portion of pyroelectric material arranged between at least one lower electrode and at least one upper electrode, with the lower electrode arranged between the substrate and the portion of pyroelectric material,
- a dielectric layer such that the upper electrode is arranged between the portion of pyroelectric material and the dielectric layer,
- a heating element including at least one deposition of electrically conductive particles and such that the dielectric layer is arranged between the upper electrode and the heating element,
- a protective layer arranged between the dielectric layer and the heating element and including at least one material of which the Shore A hardness is greater than or equal to around 60.

With the presence of such a hard protective layer arranged between the dielectric layer and the heating element, a pressing, for example by the finger of which the print is intended to be captured, on the sensor does not lead to degradation within the pixels, and this is so even if the heating element is formed by a deposition of electrically conductive particles having salient angles and/or having a certain roughness. By preventing the electrically conductive particles of the deposition forming the heating element from piercing the dielectric layer that covers the upper electrode, the integrity of the pixels of the sensor is preserved and the creation of important leakage currents within the pixels is avoided.

The dielectric layer may have a Shore A hardness less than 60, or a hardness less than 3H measured by the implementation of a scratch hardness test.

The hardness of the material of the protective layer may be measured by a Shore hardness tester, according to one of the ISO 868 and 7619, ASTM D 2240 and DIN 53505 standards.

Alternatively, the value of the hardness of the material of the protective layer may be defined as being greater than or equal to 3H, measured by the implementation of a scratch hardness test according to the ISO 15184:2012 standard.

The lower and upper electrodes and the portion of pyroelectric material can form a stack arranged on the substrate.

The dielectric layer and the protective layer correspond to two distinct layers.

The thickness of the protective layer may be between around 100 nm and 600 nm. With such a thickness, the protective layer offers good mechanical protection of the dielectric layer while reducing its impact on the thermal transfer between the pyroelectric capacitance and the element of which the thermal pattern is intended to be captured.

The material of the protective layer may be cross-linkable and have covalent bonds between the atoms of this material.

The protective layer may comprise at least one cross-linkable organic polymer material and/or at least one inorganic material of sol-gel and/or SOG (Spin-On-Glass) type and/or a ceramic material of sol-gel type (an organometallic material which, after annealing, creates a network similar to a network obtained by cross-linking).

The SOG may correspond to the material obtained after an annealing of a liquid solution containing siloxane or silicate in a solvent such as an alcohol.

A material of sol-gel type may be obtained from organometallic precursors such as the metal alkoxide of silicon or titanium, found in organic solutions, making it possible to obtain $SiO_2$ or $TiO_2$.

The cross-linkable organic polymer material may correspond to one of the following materials: epoxy, polyurethane, acrylic, and/or the SOG may correspond to one of the following materials: PMMSQ, MSQ, polyquinoxaline, and/or the inorganic material of sol-gel type may comprise at least one of the following compounds: $Al_2O_3$, $TiO_2$, $WO_3$, $SiO_2$.

The heating element may comprise at least one layer of silver particles. On account of the salient angles of the silver particles, the protective layer is particularly useful in the presence of such a heating element.

The sensor may be such that:
- the substrate includes at least one plastic material, and/or
- the lower and upper electrodes comprise at least one of the following materials: silver, gold, copper, nickel, carbon, graphene, conductive polymer.

Such materials are suited for the at least partial production of the thermal pattern sensor by printing.

A printing deposition corresponds for example to the carrying out of a deposition of material by at least one of the following techniques: screen printing, photogravure, ink jet, flexography, or offset etching.

Advantageously, the thermal pattern sensor may be a finger print sensor.

A method for producing a thermal pattern sensor comprising several pixels arranged on a substrate is also proposed, each produced by the implementation of the following steps:
- producing at least one lower electrode on the substrate;
- producing at least one portion of pyroelectric material at least on the lower electrode;
- producing at least one upper electrode on the portion of pyroelectric material;
- producing at least one dielectric layer at least on the upper electrode;
- producing at least one protective layer on the dielectric layer;
- producing at least one heating element on the protective layer;

in which the lower electrode, the upper electrode and the portion of pyroelectric material form a pyroelectric capacitance, and in which the protective layer comprises at least one material of which the Shore A hardness is greater than or equal to around 60.

The production of the heating element may comprise a deposition of electrically conductive particles.

The heating element may comprise at least one layer of silver particles formed by a printing deposition.

The lower electrode and/or the upper electrode and/or the portion of pyroelectric material may be produced by printing depositions.

BRIEF DESCRIPTION OF THE DRAWINGS

The present invention will be better understood on reading the description of exemplary embodiments given purely for illustrative purposes and in no way limiting while referring to the appended drawings in which:

FIG. 1 shows, schematically, a sectional view of a pixel of a thermal pattern sensor, according to a particular embodiment.

Identical, similar or equivalent parts of the different figures described hereafter bear the same numerical references in order to make it easier to go from one figure to the next.

The different parts shown in the figures are not necessarily according to a uniform scale, in order to make the figures more legible.

The different possibilities (alternatives and embodiments) should be understood as not being mutually exclusive and may be combined together.

DETAILED DESCRIPTION OF PARTICULAR EMBODIMENTS

Reference is made to FIG. 1 which shows a sectional view of a pixel 102 of a thermal pattern sensor 100 according to a particular embodiment.

The pixel 102 is produced on a substrate 104. The substrate 104 is here a flexible substrate comprising plastic material, including for example polyimide and/or PEN (poly (ethylene naphtalate)) and/or PET (poly(ethylene terephthalate)), on which the different elements of the sensor 100 (pyroelectric capacitances of the pixels 102, or TFT (thin film transistors) in the case of a sensor 100 with an active matrix, etc.), are produced using printed technology.

The thickness of the substrate 104 (dimension along the Z axis shown in FIG. 1) is for example equal to around 125 µm or more generally between around 50 µm and 250 µm.

A single pixel 102 is shown in FIG. 1, for greater legibility, but the thermal pattern sensor 100 comprises a plurality of pixels 102 produced on the substrate 104. The pixels 102 of the thermal pattern sensor 100 are here arranged by forming a matrix of several lines and several columns of pixels 102. The pitch of the pixels 102 (distance between the centres of two neighbouring pixels 102), in the plane (X,Y) (that is to say the plane of the substrate 104), is for example between around 50 µm and several centimetres. In the case of a sensor of resolution equal to 500 dpi (dots per inch), the pitch of the pixels 102 is equal to 50.8 µm.

Each of the pixels 102 of the thermal pattern sensor 100 comprises thermal measurement, or detection, means formed by a pyroelectric capacitance. Each pyroelectric capacitance comprises a portion of pyroelectric material 106 arranged between a lower electrode 108 and an upper electrode 110.

The pyroelectric material of the portion 106 is here a copolymer, advantageously P(VDF-TrFE) and/or PVDF. In an alternative, the portion 106 may comprise AlN and/or PZT and/or any other pyroelectric material suited to form a pyroelectric capacitance. The thickness of the portion 106 (dimension along the Z axis shown in FIG. 1) is for example equal to around 3 µm, and for example between around 2 and 10 µm. Generally speaking, the pyroelectric material of the portion 106 is an organic material which, using printed technology, is non-cross-linkable.

The lower electrode 108 and the upper electrode 110 each comprise at least one electrically conductive material. The electrodes 108, 110 may comprise silver, gold, copper, nickel, carbon, graphene or a conductive polymer such as PEDOT:PSS (poly(3,4-ethylenedioxythiophene). The thickness of each of the electrodes 108, 110 is for example between around 0.01 µm and 1 µm. The thickness of each of the electrodes 108, 110 may be greater and be between around 0.01 µm and 3 µm.

The upper electrode 110 and/or the lower electrode 108 are produced for example in the form of metal lines parallel with each other. Thus, the lower electrodes 108 and/or the upper electrodes 110 are for example produced in the form of lines each having a width equal to around 40 µm and spaced apart by a distance equal to around 40 µm.

One of the upper and lower electrodes 108, 110, here the upper electrode 110, is intended to be connected to a reference electrical potential and also serves as ground plane in the sensor 100. The other electrode, that is to say here the lower electrode 108, is intended to receive the electrical charges generated during the measurement of the thermal pattern by the sensor 100.

The upper electrode 110 is covered by a dielectric layer 112. The thickness of the dielectric layer 112 ranges for example from 0.1 µm to 5 µm, and is preferably equal to around 1 µm. The dielectric layer 112 is, for example, made of polyimide.

In the embodiment where the thermal pattern sensor 100 is suited to producing an active thermal detection, in addition to the elements described previously, the sensor 100 also comprises heating elements 114 dissipating a certain amount of heat in the pixels 102, and notably in the pyroelectric material of the portion 106. The material(s) serving to produce the heating element(s) 114 of each pixel 102 may be similar to those mentioned previously for the production of the electrodes 108, 110. The heating elements 114 are, for example, produced in the form of metal lines parallel with each other.

The heating elements 114 have, for example, a thickness ranging from 0.03 µm to 10 µm, and preferably ranging from 0.2 µm to 1 µm.

Each of the heating elements 114 forms a resistive metal element (electrical resistance for example between around 10Ω and 100Ω) associated with a pixel 102 and which makes it possible to heat this pixel 102. The heating elements 114 make it possible, during a detection implemented by the sensor 100, to dissipate a certain amount of heat in the pixels 102, and notably in the pyroelectric material of the portion 106. In each pixel 102, the heating of the portion 106 of pyroelectric material is obtained by making a current circulate in the heating element 114 forming the heating resistance of each of the pixels 102. In order to obtain good detection sensitivity, reflecting a strong difference in temperatures between a pixel in contact with a ridge of the print and a pixel in contact with a valley of the print, the electric power injected by the heating elements 114 may range from 0.5 mW/pixel to 5 mW/pixel in the case of pixels having sides of dimension equal to around 50 µm (as is the case for a standard finger print sensor of resolution equal to 500 dpi).

Due to the fact that the heating element 114 is formed by a deposition of conductive particles obtained for example from an ink deposited by printing, the pyroelectric capacitance of the pixel 102 is here protected mechanically vis-à-vis the conductive particles forming the heating element 114 by a protective layer 200 arranged between the heating element 114 and the dielectric layer 112.

This mechanical protection is conferred by the hardness of the material of the protective layer 200. This material has a Shore A hardness greater than or equal to around 60. It is also possible to qualify the hardness of this material by implementing a scratch resistance test, this hardness being greater than or equal to the value 3H.

The material of the protective layer 200 is here a cross-linkable organic polymer material. In an alternative, it is possible that the material of the protective layer 200 is an inorganic material of SOG or sol-gel type that hardens after the implementation of a thermal annealing. To improve the hardness of such inorganic materials, another annealing may be implemented, for example with a pulse lamp of UV Flash type of wavelength equal to around 190 nm or instead using an excimer laser of wavelength equal to around 248 nm.

In addition, the thickness of the protective layer 200 is for example between around 50 nm and 1 µm, and preferably between around 100 nm and 600 nm. The thickness of the protective layer 200 is preferably less than around 600 nm in order to limit its impact on the heating produced by the heating element 114, that is to say limit the absorption, by the protective layer, of the heat generated by the heating element 114. The thickness of the protective layer 200 is preferably greater than around 100 nm in order to confer very good mechanical protection of the dielectric layer 112 vis-à-vis the heating element 114.

The protective layer 200 comprises for example one or more organic cross-linkable polymer materials such as for example: epoxy, polyurethane, acrylic. In an alternative, the material of the protective layer 200 may be of SOG (Spin-On-Glass) type such as PMMSQ or MSQ (methylsilsesquioxane), polyquinoxaline, sol-gel ceramic.

When the protective layer 200 comprises such organic polymer materials, at least one UV and/or heat sensitive cross-linking agent may be used during the elaboration of the protective layer 200.

The protective layer 200 may also comprise one or more inorganic materials obtained by a method of sol-gel type, such as metal oxides, such as for example: $Al_2O_3$, $TiO_2$, $WO_3$, or instead $SiO_2$.

The heating elements 114 as well as the parts of the protective layer 200 on which the heating elements 114 are not present are covered by an encapsulation layer 116, corresponding for example to a laminated layer of PET or any other material suited to the production of this layer 116. Other materials may be envisaged for this layer 116, such as for example polyimide, PVDF and/or copolymers thereof, PMMA, etc. The material(s) used and the thickness of the layer 116 are chosen so as to obtain good heat transfer from a front face 118 of the sensor 100 to the pyroelectric capacitances of the pixels 102. Thus, the encapsulation layer 116 is produced such that it is neither too thermally resistive (because heat would not pass through it), nor too thermally conductive (because heat would in this case leave from the sides, to the other pixels, causing diathermy within the sensor 100), nor too thick (to have a heat transfer that takes place from the front face 118 of the sensor 100 to the pyroelectric capacitance), nor too thin (the thickness of the layer 116 must all the same be sufficient in order to fulfil its protective role). The thickness of the encapsulation layer 116 may range from around 1 micron to around 10 µm, and is for example between around 3 µm and 5 µm, for example equal to around 4 µm. Alternatively, the encapsulation layer 116 may correspond to a layer of DLC (diamond like carbon) of thickness less than around 1 µm.

The upper face 118 of the encapsulation layer 116 corresponds to the surface on which is located the element of which the thermal pattern is intended to be detected, for example a finger of which the print is intended to be detected. In FIG. 1, the reference 10 designates the finger present on the sensor 100.

According to an advantageous configuration of the sensor 100, the lower electrodes 108 are produced in the form of conductive lines parallel with each other and oriented along a first direction, the upper electrodes 110 are produced in the form of a conductive layer also serving as ground plane, and the heating elements 114 are produced in the form of conductive lines parallel with each other and oriented along a second direction substantially perpendicular to the first direction. Seen from above, the intersections between the lines forming the lower electrodes 108 and those forming the heating elements 114 correspond to the pixels 102, that is to say to the zones of detection by the pyroelectric material of the portions 106.

The table below givens an advantageous exemplary embodiment of a pixel 102 of the thermal pattern sensor 100.

|  | MATERIAL | THICKNESS |
| --- | --- | --- |
| Encapsulation layer 116 | PET | Between 3 µm and 10 µm |
| Heating element 114 | Ag | 1 µm |
| Protective layer 200 | MSQ | 600 nm |
| Dielectric layer 112 | Polyimide | Between 0.2 µm and 1 µm |
| Upper electrode 110 | PEDOT:PSS or Ag | Between 0.6 µm and 1 µm |
| Pyroelectric portion 106 | PVDF-TrFE | Between 2 µm and 3 µm |
| Lower electrode 108 | Au | 0.03 µm |
| Substrate 104 | PEN | 125 µm |

The MSQ indicated in the above table corresponds for example to the product known as LKD-5109 and sold by the JSR© Company and which forms a porous low-k dielectric material (dielectric permittivity less than around 3.9).

The thermal pattern sensor 100 described above corresponds to a sensor produced using printed technology, that is to say in which at least one part of the different elements present on the substrate 104 are deposited by the implementation of printing techniques: screen printing, photogravure, ink jet, flexography, or offset etching, and resorting to inks compatible with these deposition techniques. The sensor 100 here comprises at least the heating elements 114 produced by deposition of printing type.

An example of method for manufacturing the thermal pattern sensor 100 is described below.

The sensor is produced from the substrate 104. The material of the substrate 104 (glass, semiconductor, plastic, etc.) is chosen according to the technology with which the different elements of the sensor 100 are produced. The substrate 104 is firstly cleaned in order to eliminate the organic residues present thereon. The type of cleaning implemented is a function of the material of the substrate 104.

The second step consists in making on the front face 118 of the substrate 104 the lower electrodes 108 by printing an electrically conductive ink (for example screen printing, spraying or by ink jet). In an alternative, the lower electrodes 108 may be made by a deposition of a first electrically conductive layer, for example metal, from which the lower electrodes 108 are produced by photolithography and etching of this first layer. For example, for the production of lower electrodes 108 comprising gold, these lower electrodes 108 are formed by carrying out a deposition of a gold layer having a thickness for example equal to around 30 nm, this layer next being subjected to a photolithography then etched to form the lower electrodes 108.

The pyroelectric material forming the portions 106 is next deposited by printing on the lower electrodes 108. In non-printed technology, the portions 106 are defined by the implementation of a photolithography and an etching of a layer of pyroelectric material. When the etching implemented corresponds to a plasma etching, an $O_2$ plasma may be used alone or in combination with $SF_6$ (sulphur hexafluoride). The portions of pyroelectric material conserved after the implementation of this etching correspond to the portions 106 of the pyroelectric material localised at the pixels 102 of the sensor 100.

The upper electrodes 110 are next deposited, for example by printing, as described previously.

The dielectric layer 112 is next deposited on the upper electrodes 110 and the parts of pyroelectric material not covered by the upper electrodes 110.

The material of the protective layer 200 is next deposited on the dielectric layer 112, then cross-linked in order to form the protective layer 200. The technique implemented to form the protective layer 200 is a function of the nature of the material used to form this layer.

For example, a protective layer 200 including MSQ may be produced by depositing by screen printing a layer of LKD 5109 sold by the JSR© Company with a thickness equal to around 600 nm. A first annealing of the deposited layer may be implemented on a hot plate, at a temperature equal to around 80° C. and for a duration equal to around 5 min. A second annealing of the deposited layer may next be implemented in an oven, at a temperature equal to around 150° C. and for a duration equal to around 30 min. To further improve the hardness of the layer obtained, it is possible to expose the layer to ultraviolet radiation obtained for example with an excimer laser of wavelength equal to 248 nm, under a fluence between around 20 $mJ/cm^2$ and 200 $mJ/cm^2$, with pulses of duration equal to around 30 ns, and with a number of exposures of the material of the layer to the laser beam for example equal to 5.

The sensor 100 is next finished by producing the heating elements 114 and the encapsulation layer 116. The heating elements 114 may be produced in the form of coils or rectangular lines. When the material of the encapsulation layer 116 is deposited in a localised manner, such as for example by spraying or by ink jet, the encapsulation layer 116 is formed as of the deposition in a localised manner on the heating elements 114 and the potential parts of pyroelectric material not covered by the heating elements 114.

In the different examples described previously, the thermal pattern sensor 100 is used as a finger print detector. However, the sensor 100 may be used to form a palm print sensor, notably when the sensor 100 has significant dimensions and is produced by printing on a flexible substrate. The sensor 100 may also be suited to carrying out a detection of thermal patterns other than finger prints, due to the fact that each pixel 102 of the sensor 100 reads the calorific capacitance placed above it and does so whatever the nature of the thermal pattern.

In addition, the thermal pattern sensor 100 may also serve to produce an uncooled infrared imager. The pixels 102 of the sensor 100 are in this case integrated on an integrated circuit of CCD or CMOS type collecting the electrical charges generated by the sensor. Such an imager further comprises an infrared lens filtering the light arriving on the sensor. In order that the sensor 100 can be subjected to a difference in temperature (necessary given the measurement carried out by the pyroelectric capacitances), the imager comprises a device making it possible to successively block the infrared light arriving on the sensor then to allow this light to get through. Such a device may correspond to a "chopper", that is to say a wheel provided with a hole and turning in front of the sensor. An absorber element may be added to the pyroelectric material in order to improve the absorption of the infrared radiation received.

The invention claimed is:

1. Thermal pattern sensor comprising several pixels arranged on a substrate, each pixel including at least:
   a pyroelectric capacitance formed by at least one portion of pyroelectric material arranged between at least one lower electrode and at least one upper electrode, with the lower electrode arranged between the substrate and the portion of pyroelectric material,
   a dielectric layer such that the upper electrode is arranged between the portion of pyroelectric material and the dielectric layer,
   a heating element including at least one deposition of electrically conductive particles and such that the dielectric layer is arranged between the upper electrode and the heating element,
   a protective layer arranged between the dielectric layer and the heating element and including at least one material of which the Shore A hardness is greater than or equal to around 60.

2. Thermal pattern sensor according to claim 1, in which the thickness of the protective layer is between around 100 nm and 600 nm.

3. Thermal pattern sensor according to claim 1, in which the protective layer comprises at least one cross-linkable organic polymer material and/or at least one inorganic material of sol-gel and/or SOG type and/or a ceramic material of sol-gel type.

4. Thermal pattern sensor according to claim 3, in which the cross-linkable organic polymer material corresponds to one of the following materials: epoxy, polyurethane, acrylic, or in which the SOG corresponds to one of the following materials: PMMSQ, MSQ, polyquinoxaline, or in which the inorganic material of sol-gel type comprises at least one of the following compounds: $Al_2O_3$, $TiO_2$, $WO_3$, $SiO_2$.

5. Thermal pattern sensor according to claim 1, in which the heating element comprises at least one layer of silver particles.

6. Thermal pattern sensor according to claim 1, in which the substrate includes at least one plastic material.

7. Thermal pattern sensor according to claim 1, in which the lower and upper electrodes comprise at least one of the following materials: silver, gold, copper, nickel, carbon, graphene, conductive polymer.

8. Thermal pattern sensor according to claim 1, in which said thermal pattern sensor is a finger print sensor.

9. Method for producing a thermal pattern sensor comprising several pixels arranged on a substrate, each produced by the implementation of the following steps:
   producing at least one lower electrode on a substrate;
   producing at least one portion of pyroelectric material at least on the lower electrode;
   producing at least one upper electrode on the portion of pyroelectric material;
   producing at least one dielectric layer at least on the upper electrode;
   producing at least one protective layer on the dielectric layer;
   producing at least one heating element on the protective layer;
   in which the lower electrode, the upper electrode and the portion of pyroelectric material form a pyroelectric capacitance, and in which the protective layer comprises a material of which the Shore A hardness is greater than or equal to around 60.

10. Method according to claim 9, in which the heating element comprises at least one layer of silver particles formed by a printing deposition.

11. Method according to claim 9, in which the lower electrode and/or the upper electrode and/or the portion of pyroelectric material are produced by printing depositions.

12. Method according to claim 9, in which said thermal pattern sensor is a finger print sensor.

\* \* \* \* \*